(12) United States Patent
Horii et al.

(10) Patent No.: US 12,367,411 B2
(45) Date of Patent: Jul. 22, 2025

(54) ENABLEMENT OF SAMPLING-OPTIMIZATION FOR GATE-LEVEL SIMULATION

(71) Applicant: International Business Machines Corporation, Armonk, NY (US)

(72) Inventors: Hiroshi Horii, Tokyo (JP); Ikko Hamamura, Tokyo (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 764 days.

(21) Appl. No.: 17/550,436

(22) Filed: Dec. 14, 2021

(65) Prior Publication Data

US 2023/0186129 A1    Jun. 15, 2023

(51) Int. Cl.
| | | |
|---|---|---|
| *G06F 30/3308* | (2020.01) | |
| *G06N 10/20* | (2022.01) | |
| *G06N 10/40* | (2022.01) | |
| *G06N 10/70* | (2022.01) | |
| *G06N 10/80* | (2022.01) | |

(52) U.S. Cl.
CPC ......... *G06N 10/20* (2022.01); *G06F 30/3308* (2020.01); *G06N 10/40* (2022.01); *G06N 10/70* (2022.01); *G06N 10/80* (2022.01)

(58) Field of Classification Search
None
See application file for complete search history.

(56) References Cited

U.S. PATENT DOCUMENTS

| | | | |
|---|---|---|---|
| 9,064,067 B2 | 6/2015 | Wecker | |
| 10,909,286 B2 | 2/2021 | Johnston | |
| 10,929,294 B2* | 2/2021 | Brahm | G06F 16/9038 |
| 11,010,517 B2 | 5/2021 | Nam et al. | |
| 11,042,685 B2 | 6/2021 | Martiel et al. | |
| 11,093,669 B2 | 8/2021 | Chen et al. | |

(Continued)

FOREIGN PATENT DOCUMENTS

CN      110073372 A     7/2019

OTHER PUBLICATIONS

A.J. Smith, "Cache Memories," Computing Surveys, vol. 14, No. 3, Sep. 1982, pp. 473-530. (Year: 1982).*

(Continued)

*Primary Examiner* — Leigh M Garbowski
(74) *Attorney, Agent, or Firm* — Amin, Turocy & Watson, LLP

(57) ABSTRACT

Systems, computer-implemented methods, and computer program products to facilitate sampling-optimization for gate-level simulations are provided. According to an embodiment, a system can comprise a processor that executes computer executable components stored in memory. The computer executable components comprise a cache component that caches a state of a set of qubits within a quantum gate-level simulation after the set of qubits are reset. According to another embodiment the computer executable components further comprise an avoidance component that prevents duplicated simulation of quantum gates in the quantum gate-level simulation by using the cached state of the set of qubits to represent a quantum state produced by a previously simulated quantum gate.

20 Claims, 10 Drawing Sheets

(56) References Cited

U.S. PATENT DOCUMENTS

| | | | |
|---|---|---|---|
| 11,100,417 | B2 | 8/2021 | Padnault et al. |
| 11,341,303 | B2* | 5/2022 | Roetteler ............... G06F 30/327 |
| 11,488,049 | B2* | 11/2022 | Cao ........................ G06N 10/00 |
| 11,507,872 | B2* | 11/2022 | Cao ........................ H03K 19/21 |
| 11,544,614 | B2* | 1/2023 | Horii ...................... G06N 10/00 |
| 2019/0156239 | A1 | 5/2019 | Martinis et al. |
| 2019/0378025 | A1 | 12/2019 | Corcoles-Gonzalez et al. |
| 2020/0134503 | A1* | 4/2020 | Lupton .................... G06N 5/01 |
| 2020/0184025 | A1 | 6/2020 | Horii et al. |
| 2020/0327441 | A1 | 10/2020 | Cao et al. |
| 2020/0380397 | A1 | 12/2020 | Quintin |
| 2020/0394547 | A1 | 12/2020 | Cao et al. |
| 2021/0049496 | A1 | 2/2021 | Kalendarov et al. |
| 2021/0133617 | A1 | 5/2021 | Sim |
| 2021/0182724 | A1 | 6/2021 | Zou et al. |
| 2021/0192114 | A1 | 6/2021 | Boixo Castrillo et al. |
| 2021/0357797 | A1* | 11/2021 | Karalekas .............. G06N 10/80 |

OTHER PUBLICATIONS

J. Doi et al., "Cache Blocking Technique to Large Scale Quantum Computing Simulation on Supercomputers," 2020 IEEE Int'l; Conference on Quantum Computing and Engineering (QCE), pp. 212-222. (Year: 2020).*

A. Fatima et al., "Faster Schrodinger-style simulation of quantum circuits," 2021 IEEE Int'l Symposium on High-Performance Computer Architecture (HPCA), pp. 194-207. (Year: 2021).*

Gong, M. et al. | "Verification of a resetting protocol for an uncontrolled superconducting qubit". npj Quantum Information (2020) 6:99; https://doi.org/10.1038/s41534-020-00329-3, 9 pages.

Medvidovic, M. et al. | "Classical variational simulation of the Quantum Approximate Optimization Algorithm". npj Quantum Information (2021) 7:101; https://doi.org/10.1038/s41534-021-00440-z, 7 pages.

Li, B. et al. | "Pulse-level noisy quantum circuits with QuTiP". arXiv:2105.09902v1 [quant-ph] May 20, 2021, 26 pages.

Wu, X. et al | "High-fidelity software-defined quantum logic on a superconducting qudit". arXiv:2005.13165v3 [quant-ph] Oct. 19, 2020, 7 pages.

Viamontes, G.F. et al. | "Improving Gate-Level Simulation of Quantum Circuits". arXiv:quant-ph/0309060v2 Nov. 29, 2003, 22 pages.

Openqasm Live Specification | "Classical instructions". Webpage, https://qiskit.github.io/openqasm/language/classical.html, last accessed Nov. 2, 2021, 5 pages.

International Search Report and Written Opinion received for International PCT Application Serial No. PCT/CN2022/108416 dated Oct. 10, 2022, 9 pages.

* cited by examiner

ENABLEMENT OF SAMPLING-OPTIMIZATION FOR GATE-LEVEL SIMULATION

BACKGROUND

The subject disclosure relates to quantum simulations, and more specifically to sampling-optimization of gate-level simulations.

The use of quantum simulations and quantum computing have great potential to address a variety of challenges involved in computing and data processing. For example, quantum simulations and quantum computing offer an opportunity to approaches for solving problems in a way fundamentally different from classical computing. Currently, quantum simulators can generally be divided into two classes: circuit-level simulators which simulate an entire circuit as a unit, and gate-level simulations that simulate a quantum circuit as a series of individual gates. Gate-level simulations allow for dynamic circuits due to the use of individual gates. The inventors have observed that known quantum gate-level simulations are less than optimal.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, and/or computer program products that facilitate sampling-optimization for gate-level simulations are described.

According to an embodiment, a system can comprise a processor that executes computer executable components stored in memory. The computer executable components comprise a cache component that caches a state of a set of qubits within a quantum gate-level simulation after the set of qubits are reset. An advantage of such a system is that the cached state can be used to represent a simulated gate.

In some embodiments, the computer executable components further comprise an avoidance component that prevents duplicated simulation of quantum gates in the quantum gate-level simulation by using the cached state of the set of qubits to represent a quantum state produced by a previously simulated quantum gate. An advantage of such a system is that it can reduce the overall number of quantum gates executed in a gate-level simulation.

According to another embodiment, a computer-implemented method can comprise caching, by a system, operatively coupled to a processor, a state of a set of qubits within a quantum gate-level simulation after the set of qubits are reset. An advantage of such a computer-implemented method is that the cached state can be used to represent a simulated gate.

In some embodiments, the above computer-implemented method can further comprise, avoiding duplicated simulation of quantum gates in the quantum gate-level simulation by using the cached state of the set of qubits to represent a quantum state produced by a previously simulated quantum gate. An advantage of such a computer-implemented method is that it can reduce the overall number of quantum gates executed in a gate-level simulation.

According to another embodiment, a computer program product comprising a computer readable storage medium having program instructions embodied therewith, the program instructions executable by a processor to cause the processor to cache a state of a set of qubits within a quantum gate-level simulation after the set of qubits are reset. An advantage of such a computer program product is that the cached state can be used to represent a simulated gate.

In some embodiments, the program instructions are further executable by the processor to cause the processor to avoid duplicated simulation of quantum gates in the quantum gate-level simulation by using the cached state of the set of qubits to represent a quantum state produced by a previously simulated quantum gate. An advantage of such a computer program product is that it can reduce the overall number of quantum gates executed in a gate-level simulation.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

The inventors have observed that existing gate-level simulations suffer from the that they cannot be optimized. Due to the large number of iterations that are often performed on quantum simulations, this can create an issue as there can be a large number of shared gates between multiple iterations. This creates a situation where the same quantum gates are simulated multiple times leading to inefficiency in the gate-level simulation. The present disclosure can be implemented to produce solutions to these problems in the forms of systems, computer-implemented methods, and/or computer program products that can facilitate sampling-optimization for gate-level simulations by, e.g., caching a state of a set of qubits within a quantum gate-level simulation after the set of qubits are reset along with other exemplary features, for example. An advantage of such systems, computer-implemented methods, and computer program products is that the cached state can be used to represent a simulated gate.

In some embodiments, the present disclosure can be implemented to yield systems, computer-implemented methods, and/or computer program products that can further facilitate sampling-optimization in gate-level simulations by: avoiding duplicated quantum gate-level simulation by using the cached state of the set of qubits to represent a quantum state produced by a previously simulated quantum gate. An advantage of such systems, computer-implemented methods, and/or computer program products is that is they can be implemented to reduce the overall number of quantum gates executed in a gate-level simulation.

Figure 1:
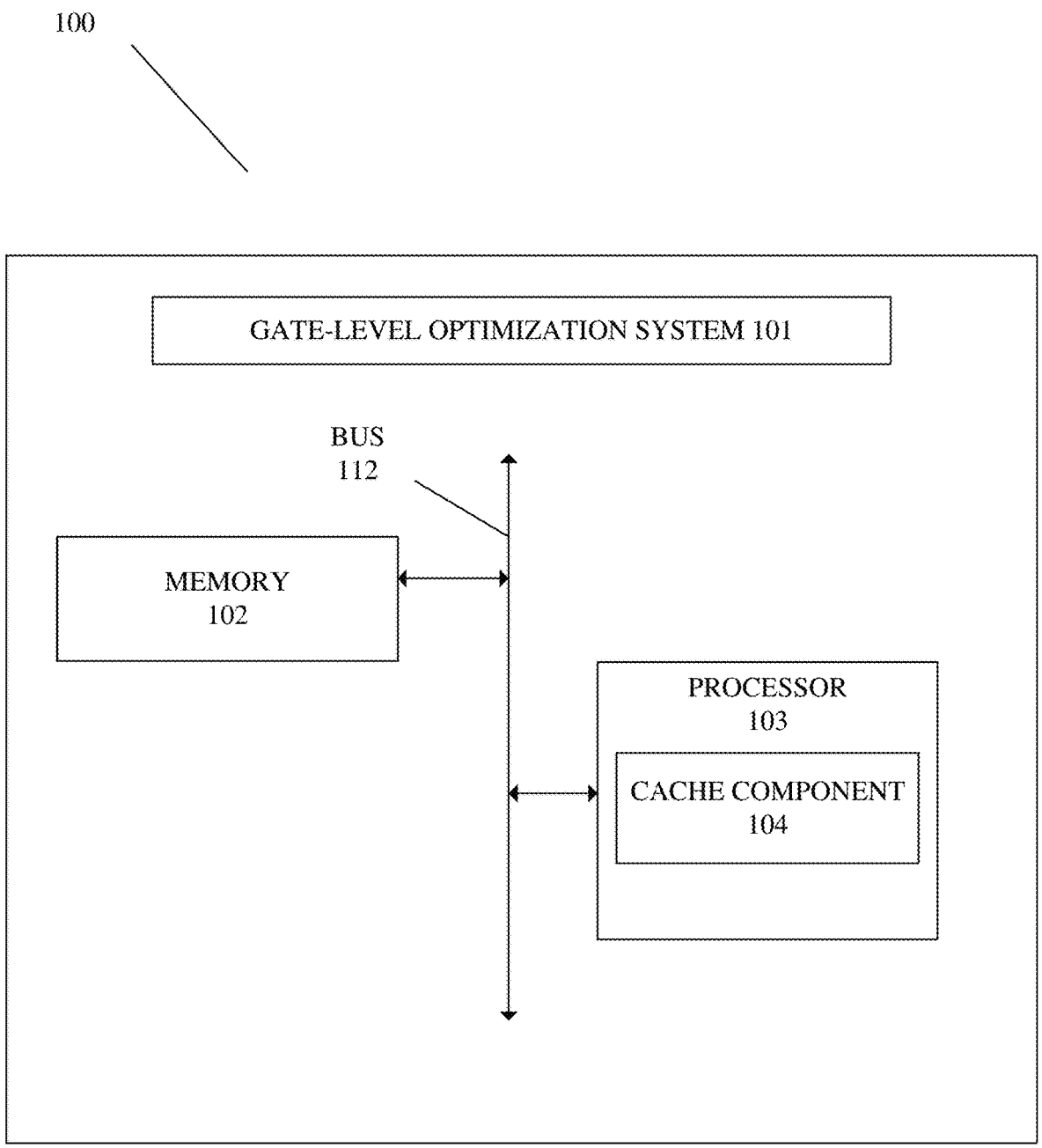
FIGS. 1 and 2 illustrate block diagrams of example, non-limiting systems that can facilitate sampling-optimization for gate-level simulations in accordance with one or more embodiments described herein.
Figure 2:
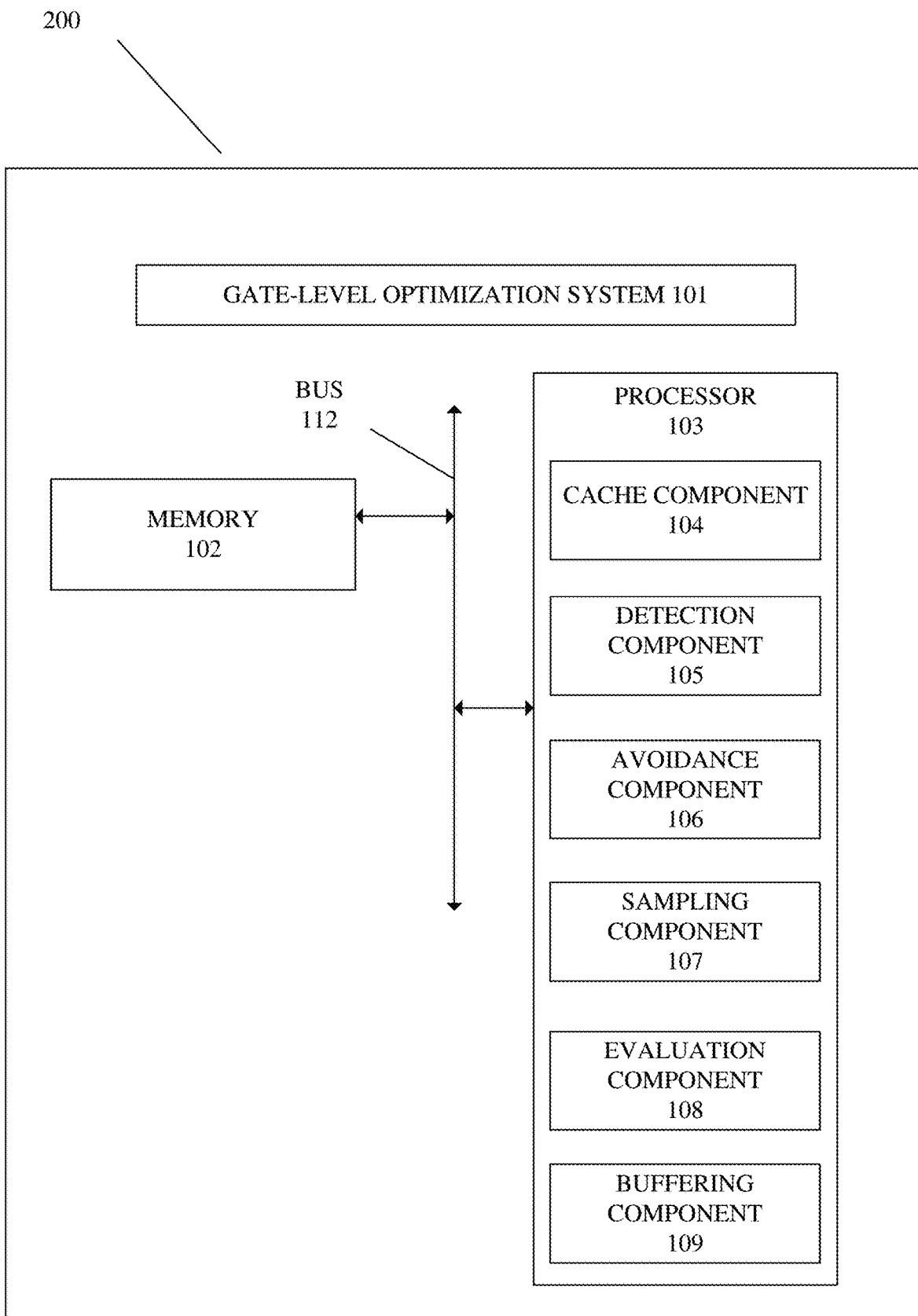

FIGS. 1 and 2 illustrate block diagrams of example, non-limiting systems 100 and 200 respectfully that can facilitate sampling-optimization for gate-level simulations. System 100 can comprise gate-level optimization system 101. Gate-level optimization system 101 of system 100 can comprise a memory 102, a processor 103, and a cache component 104. Gate-level optimization system 101 of system 200 depicted in FIG. 2 can further comprise detection component 105, avoidance component 106, sampling component 107, evaluation component 108, and buffering component 109.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100, system 200 and/or gate-level optimization system 101 can further comprise various computer and/or computing-based elements described herein with reference to operating environment 1000 and FIG. 10. In several embodiments, such computer and/or computing-based elements can be used in connection with implementing one or more of the systems, devices, components, and/or computer-implemented operations shown and described in connection with FIGS. 1 and 2 and/or other figures disclosed herein.

Memory 102 can store one or more computer and/or machine readable, writable, and/or executable components and/or instructions that, when executed by processor 103 (e.g., a classical processor, a quantum processor, and/or another type of processor), can facilitate performance of operations defined by the executable component(s) and/or instruction(s). For example, memory 102 can store computer and/or machine readable, writable, and/or executable components and/or instructions that, when executed by processor 103, can facilitate execution of the various functions described herein relating to gate-level optimization system 101, cache component 104, detection component 105, avoidance component 106, sampling component 107, evaluation component 108, buffering component 109, and/or another component associated with gate-level optimization system 101 as described herein with or without reference to the various figures of the subject disclosure.

Memory 102 can comprise volatile memory (e.g., random access memory (RAM), static RAM (SRAM), dynamic RAM (DRAM), and/or another type of volatile memory) and/or non-volatile memory (e.g., read only memory (ROM), programmable ROM (PROM), electrically programmable ROM (EPROM), electrically erasable programmable ROM (EEPROM), and/or another type of non-volatile memory) that can employ one or more memory architectures. Further examples of memory 102 are described below with reference to system memory 1016 and FIG. 10. Such examples of memory 102 can be employed to implement any embodiments of the subject disclosure.

Processor 103 can comprise one or more types of processors and/or electronic circuitry (e.g., a classical processor, a quantum processor, and/or another type of processor and/or electronic circuitry) that can implement one or more computer and/or machine readable, writable, and/or executable components and/or instructions that can be stored on memory 102. For example, processor 103 can perform various operations that can be specified by such computer and/or machine readable, writable, and/or executable components and/or instructions including, but not limited to, logic, control, input/output (I/O), arithmetic, and/or the like. In some embodiments, processor 103 can comprise one or more central processing unit, multi-core processor, microprocessor, dual microprocessors, microcontroller, System on a Chip (SOC), array processor, vector processor, quantum processor, and/or another type of processor. Further examples of processor 103 are described below with reference to processing unit 1014 and FIG. 10. Such examples of processor 103 can be employed to implement any embodiments of the subject disclosure.

Gate-level optimization system 101, memory 102, processor 103, cache component 104, detection component 105, avoidance component 106, sampling component 107, evaluation component 108, buffering component 109, and/or another and/or another component of gate-level optimization system 101 as described herein can be communicatively, electrically, operatively, and/or optically coupled to one another via bus 112 to perform functions of system 100, system 200, gate-level optimization system 101, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 1018 and FIG. 10. Such examples of bus 112 can be employed to implement any embodiments of the subject disclosure.

Gate-level optimization system 101 can comprise any type of component, machine, device, facility, apparatus, and/or instrument that comprises a processor and/or can be capable of effective and/or operative communication with a wired and/or wireless network. All such embodiments are envisioned. For example, gate-level optimization system 101 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Gate-level optimization system 101 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a wire and/or a cable. For example, gate-level optimization system 101 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) using a data cable including, but not limited to, a High-Definition Multimedia Interface (HDMI) cable, a recommended standard (RS) 232 cable, an Ethernet cable, and/or another data cable.

In some embodiments, gate-level optimization system 101 can be coupled (e.g., communicatively, electrically, operatively, optically, and/or coupled via another type of coupling) to one or more external systems, sources, and/or devices (e.g., classical and/or quantum computing devices, communication devices, and/or another type of external system, source, and/or device) via a network. For example, such a network can comprise wired and/or wireless networks, including, but not limited to, a cellular network, a wide area network (WAN) (e.g., the Internet) or a local area network (LAN). Gate-level optimization system 101 can communicate with one or more external systems, sources, and/or devices, for instance, computing devices using virtually any desired wired and/or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. Therefore, in some embodiments, gate-level optimization system 101 can comprise hardware (e.g., a central processing unit (CPU), a transceiver, a decoder, quantum hardware, a quantum processor, and/or other hardware), software (e.g., a set of threads, a set of processes, software in execution, quantum pulse schedule, quantum circuit, quantum gates, and/or other software) or a combination of hardware and software that can facilitate communicating information between gate-level optimization system 101 and external systems, sources, and/or devices (e.g., computing devices, communication devices, and/or another type of external system, source, and/or device).

Gate-level optimization system 101 can comprise one or more computer and/or machine readable, writable, and/or executable components and/or instructions that, when executed by processor 103 (e.g., a classical processor, a quantum processor, and/or another type of processor), can facilitate performance of operations defined by such component(s) and/or instruction(s). Further, in numerous embodiments, any component associated with gate-level optimization system 101, as described herein with or without reference to the various figures of the subject disclosure, can comprise one or more computer and/or machine readable, writable, and/or executable components and/or instructions that, when executed by processor 103, can facilitate performance of operations defined by such component(s) and/or instruction(s). For example, cache component 104, detection component 105, avoidance component 106, sampling component 107, evaluation component 108, buffering component 109, and/or another component associated with gate-level optimization system 101 and/or another component of gate-level optimization system 101 as described herein (e.g., communicatively, electronically, operatively, and/or optically coupled with and/or employed by gate-level optimization system 101), can comprise such computer and/or machine readable, writable, and/or executable component(s) and/or instruction(s). Consequently, according to numerous embodiments, gate-level optimization system 101 and/or any components associated therewith as disclosed herein, can employ processor 103 to execute such computer and/or machine readable, writable, and/or executable component(s) and/or instruction(s) to facilitate performance of one or more operations described herein with reference to gate-level optimization system 101 and/or any such components associated therewith.

Gate-level optimization system 101 can facilitate (e.g., via processor 103) performance of operations executed by and/or associated with cache component 104, detection component 105, avoidance component 106, sampling component 107, evaluation component 108, buffering component 109, and/or another component associated with gate-level optimization system 101 as disclosed herein. For example, as described in detail below, gate-level optimization system 101 can facilitate (e.g., via processor 103): caching a state of a set of qubits within a quantum gate-level simulation after the set of qubits are reset. In another example, as described in detail below, gate-level optimization system 101 can facilitate avoiding duplicated simulation of quantum gates in the quantum gate-level simulation by using the cached state of the set of qubits to represent a quantum state produced by a previously simulated quantum gate.

Cache component 104 can cache a state of a set of qubits within a quantum gate-level simulation after the set of qubits are reset. As defined herein, a reset occurs when an iteration of the gate-level simulation is complete and the qubit which a quantum gate in the simulation outputs a state to can be reset to an initial state. In effect, by resetting the qubit, the quantum gate which output a state to that qubit is also reset back to an initial state. In a gate-level simulation, a quantum gate can be implemented which then outputs a new state to the qubit based on the architecture of the quantum gate. In an example, a series of quantum gates can be implemented in order to set the state of a set of qubits. After a reset instruction or a reset gate is received for a set of qubits within a quantum gate-level simulation, cache component 104 can cache the states of qubits within the set of qubits in order to store the result of the series of quantum gates. In an embodiment, cache component 104 can associate the state of a set of qubits at a first time with a list of quantum gates at a second time, wherein the second time is after the first time. For example, after a reset of the set of qubits at a first time, a series of quantum gates can be implemented at a second time after the first time. Cache component 104 can then associate the implemented quantum gates with the set of qubits and store the output quantum state to represent the implemented quantum gates at a later point.

Detection component 105 can detect whether the set of qubits in a quantum gate-level simulation are reset. In an embodiment detection component can detect whether the set of qubits has been reset by detecting when a quantum state of the set of qubits is initialized. For example, detection component 105 can maintain a list of performed resets. When an instruction to perform a reset of a qubit is received, detection component 105 can add that qubit to a list of performed resets. Detection component 105 can continue adding resets to the list until detection component 105 receives an instruction to implement a gate (also known as a non-reset gate instruction). Detection component 105 can then check the state of all the qubits on the list. Once all qubits on the list are reset to the quantum state of 0, detection component 105 can signal cache component 104 that a reset has taken place and detection component 105 can clear the list of qubits.

Buffering component 109 can buffer quantum gates that are not reset and not measured after the reset of the set of qubits. For example, after detection component 105 signals cache component 104 that a reset has occurred, buffering component 109 can receive instructions to implement non-measure gates. As described herein, non-measured gates are gates which do not map the state of a qubit to a series of classical bits, whereas measure gates (or measure instructions) are gates which maps the state of a qubit to a series of classical bits. When buffering component 109 receives an instruction to implement a non-measure gate, buffering component 109 adds the non-measure gate to a list of non-measure gates. When buffering component 109 receives an instruction to implement a measure gate, buffering component 109 stops adding gates to the list of non-measure gates and outputs the list of non-measure gates to cache component 104 and/or avoidance component 106.

Avoidance component 106 can prevent duplicated simulation of quantum gates in the quantum simulation by using the cached state of the set of qubits to represent a quantum state produced by a previously simulated gate. For example, avoidance component 106 can receive the list of non-measure gates from buffering component 109 in response to buffering component 109 receiving an instruction to implement a measure gate. Avoidance component 106 can then check with cache component 104 if a cached quantum state for a qubit is associated with a gate on the list of non-measure gates. If cache component 104 does have a cached state associated with the gate, then avoidance component 106 can prevent the performance of the gate and use the cached quantum state to represent the output of the gate. If cache component 104 does not contain a cached state associated with the gate, then avoidance component 106 can allow the gate to be performed and signal cache component 104 to cache the outputted quantum state and to associate the gate with the quantum state in the cache. Once avoidance component 106 has iterated through all gates in the list of non-measure gates, avoidance component 106 can clear the list of non-measure gates. In an embodiment, avoidance component 106 can use a cached quantum state as an input to a quantum gate. For example, given a first quantum gate that leads to a second quantum gate, if a cached state exists that is associated with the first quantum gate, avoidance component 106 can input the cached state to the second quantum gate and simulate the second quantum gate, rather than simulating both the first and the second quantum gate. It should be appreciated that by prevent duplicated simulation of quantum gates in the quantum simulation by using the cached state of the set of qubits to represent a quantum state produced by a previously simulated gate, avoidance component 106 can improve a gate-level simulation by decreasing the overall number of gates simulated during the simulation. For example, by using a cached state to represent the quantum state produced by a previously simulated gate, avoidance component 106 can then feed that cached state to gates that follow the previously simulated gate in multiple iterations, allowing the previously simulated gate to be simulated only once as opposed to being simulated in each iteration it is used it.

Sampling component 107 can take a sampling of all the qubits in the set of qubits when a request for a measurement of a state of a qubit in the set of qubits is received. For example, when an instruction to implement a measure gate is received, sampling component 107 can check if a previous sampling exists. If a sampling does not exist, sampling component 107 can take a sample of all qubits in the set of qubits. For example, if the set of qubits comprises three qubits and all three qubits are in the 1 state when sampling component 107 takes a sample, then the sample would be [1,1,1]. If a sampling does exist, the sampling component 107 can output the value of the qubit the measure gate is performed on and prevent the measure gate from being performed. For example, if sampling component 107 receives measurement gates for all qubits 1, 2, and 3 in the set of three qubits, sampling component 107 can output a value of 1 for qubit 1, a value of 1 for qubit 2, and a value of 1 for qubit 3 based on the sampling instead of performing all three measure gates. In another embodiment, if sampling component 107 receives an instruction to implement a non-measure gate that outputs to a qubit which is contained in the sampling, sampling component 107 can clear the bit and drop it from the sampling. For example, if sampling component 107 has a sampling [1,1,1] and receives a reset instruction for qubit 1, a non-measure gate instruction, sampling component can drop the first bit from the sampling, so that the sampling is then [-,1,1]. Similarly, if the non-measure gate instruction is for the second qubit, sampling component 107 can update the sampling to become [-,-,1]. In an embodiment, sampling component 107 can take multiple samplings at once. For example, sampling component 107 can take a sample and then store the sample multiple times in a buffer. As such, after updating the sampling in response non-measure gates, sampling component 107 can pull a new sampling from the buffer of samplings rather than having to take a new sampling.

Evaluation component 108 can perform a reset of the set of qubits by buffering the reset without performing it and performing a list of buffered resets when a gate that is not reset is received. For example, if evaluation component 108 receives instructions to reset qubits 1, 2, and 3 of the set of qubits, evaluation component 108 can create a buffer list of the resets and not perform the resets. Then, if evaluation component 108 receives an instruction to implement a non-reset gate, evaluation component 108 can perform all of the buffered resets at once. In an embodiment, evaluation component 108 can avoid the performance of a reset based on whether avoidance component determines that there is a cache of the non-reset gate. For example, if avoidance component 106 determines that a cache exists of the non-reset gate, then evaluation component 108 can avoid performing the buffered resets. This is due to the fact that a reset is only used if the no-reset gate is simulated. If a cache of the reset gate exists, and thus it will not be simulated due to avoidance component 106, then evaluation component 108 can avoid performing the buffered resets in order to improve efficiency of the gate-level simulation. It should be appreciated that by avoiding performing buffered resets if a cache of the no-reset gate exists, evaluation component can improve a gate-level simulation by decreasing the overall number of resets that are performed. For example, by decreasing the overall number of resets that are performed, the overall number of instructions performed during a gate-level simulation is decreased leading to decreased simulation time and/or increased efficiency.

Figure 3:
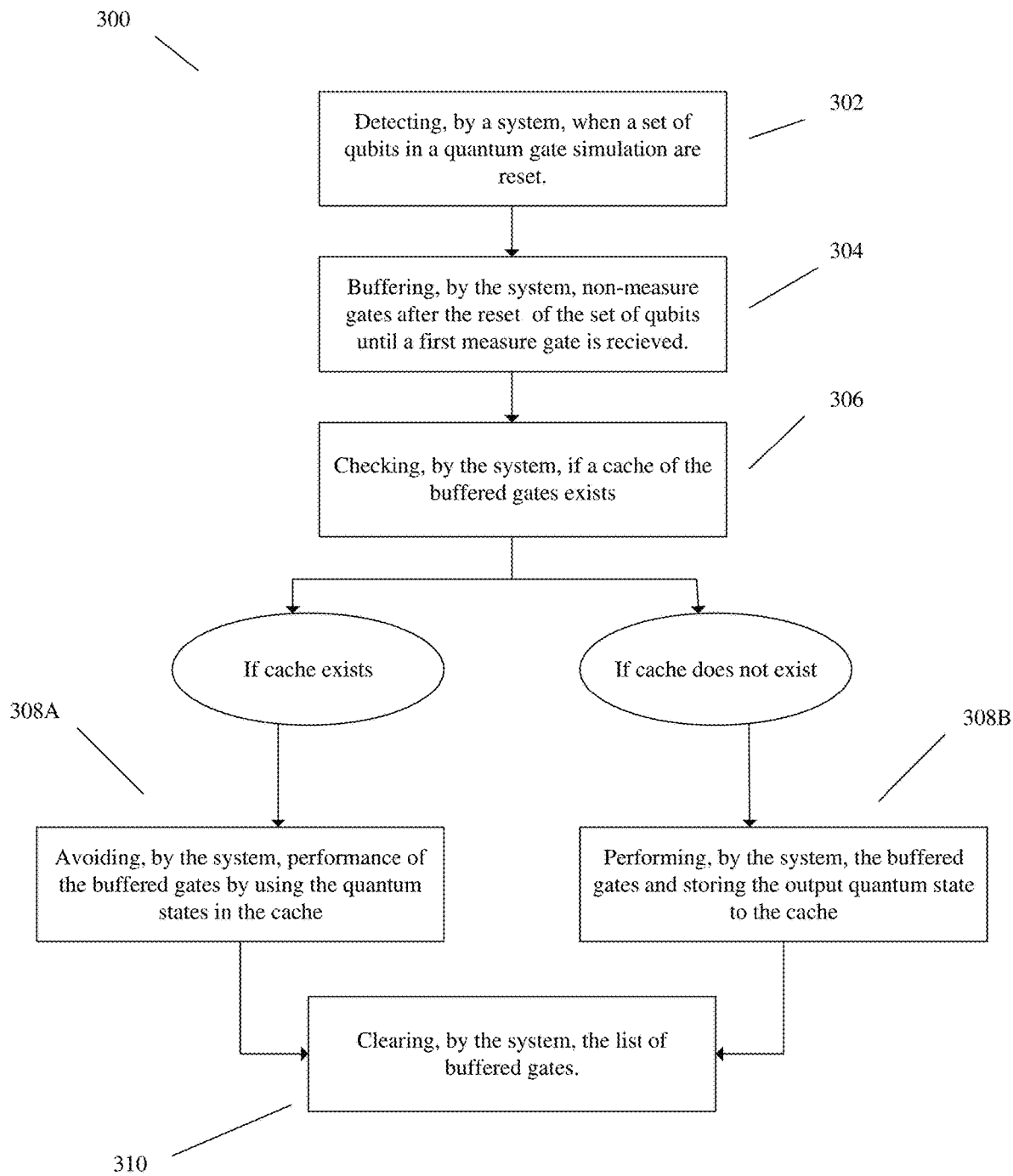
FIG. 3 illustrates a flow diagram of an example, non-limiting computer-implemented method that can facilitate quantum state caching and avoidance of duplicate quantum gate-level simulation in accordance with one or more embodiments described herein.

FIG. 3 illustrates a flow diagram of an example, non-limiting computer-implemented method 300 that can facilitate quantum state caching and avoidance of duplicate gate simulations in a quantum gate-level simulation in accordance with one or more embodiments described herein. Repetitive description of like elements and/or processes employed in respective embodiments is omitted for sake of brevity.

At 302, computer-implemented method 300 can comprise detecting, by a system (e.g., gate-level optimization system 101 and/or detection component 105) operatively coupled to a processor (e.g., processor 103), when a set of qubits in a quantum gate-level simulation are reset. For example, detection component 105 can maintain a list of performed resets. When an instruction to perform a rest of a qubit is received, detection component 105 can add that qubit to a list of performed resets. Detection component 105 can continue adding resets to the list until detection component 105 receives an instruction to implement a non-reset gate.

At 304, computer-implemented method 300 can comprise buffering, by the system (e.g., gate-level optimization system 101 and/or buffering component 109), non-measure gates after the reset of the set of qubits until a first measure gate is received. For example, after a reset is detected by detection component 105, buffering component can buffer non-measure gates, without performing the buffered gates, until a non-measure gate is received. Then buffering component can stop adding non-measure gates to the buffer and buffering component 109 can output the list of buffered gates to avoidance component 106.

At 306, computer-implemented method 300 can comprise checking, by the system (e.g., gate-level optimization system 101 and/or avoidance component 106), if a cache of the buffered gates exists.

At 308A, in response to a determination that a cache of the buffered gates exists, computer-implemented method 300 can comprise avoiding, by the system (e.g., gate-level optimization system 101 and/or avoidance component 106), performance of the buffered gates by using the quantum states in the cache. For example, in response to determining that a cache of the buffered gates exists, avoidance component 106 can prevent the performance of the buffered gates and use the cached quantum state to update the state of the qubits the buffered gates would output a quantum state to.

At 308B, in response to a determination that a cache of the buffered gates does not exist computer-implemented method 300 can comprise performing, by the system (e.g., gate-level optimization system 101 and/or cache component 104), the buffered gates and storing the output quantum states of the buffered gates to a cache. For example, in response to determining that a cache of the buffered gates does not exist, the buffered gates can be performed and cache component 104 can cache the state of the qubits output by the gates. In an embodiment, the cache can associate a key with a value, wherein the key is a buffered gate, and the value is a quantum state corresponding to the output of that buffered gate.

At 310, computer-implemented method 300 can comprise, clearing by the system (e.g., gate-level optimization system and/or avoidance component 106), the list of buffered gates.

Figure 4:
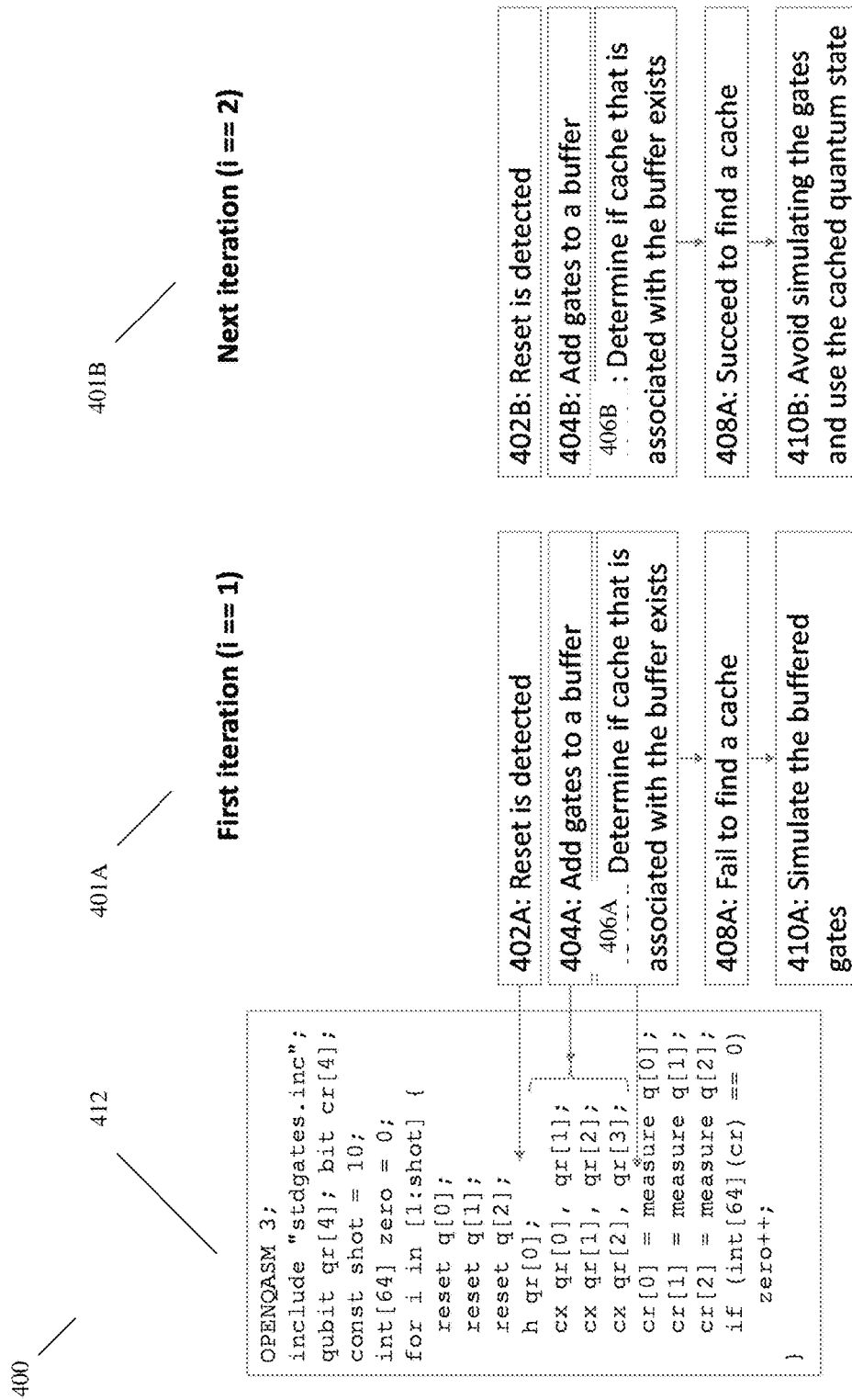
FIG. 4 illustrates an example non-limiting diagram representation of a set of quantum gate-level instructions and an implementation of caching of a quantum state of a set of qubits in accordance with one or more embodiments described herein.

FIG. 4 illustrates an example non-limiting diagram 400 representation of a set of quantum gate-level instructions and an implementation of caching of a quantum state of a set of qubits in accordance with one or more embodiments described herein.

Diagram 400 comprises an instruction set 412 to implement a gate-level simulation. As described above, gate-level simulations can utilize multiple iterations, such as in instruction set 412. In order to facilitate multiple iterations, instruction set 412 comprises a loop that iterates multiple times. Instruction set 412 comprises a simulation which utilizes 3 qubits, q [0], q [1], and q [3]. Instruction set 412 also comprises examples of reset instructions or reset gates such as reset q [0], which is a reset to a default state of q [0]. Instruction set 412 further comprises measure instructions or measure gates such as cr [0]=measure q [0], which returns a value of q [0]. Additionally, instruction set 412 comprises non-reset and non-measure gates or instructions such as cx qr [0], qr [1].

Diagram 400 additionally comprises a first iteration 401A of instruction set 412 and a second iteration 401B of instruction set 412. First iteration 401A comprises points 402A-410A, while second iteration 401B comprises points 402B-410B. Repetitive description of like elements and/or processes employed in respective embodiments is omitted for sake of brevity.

As described above in reference to FIG. 2, detection component 105 can detect a reset at point 402A. In response to receiving non-measure gate cx qr [0], qr [1], buffering component 109 can add gates cx qr [0], qr [1], cx qr [1], qr [2], and cx qr [2], qr [3] to a list of buffered gates, without simulating the gates until a first measure gate, in this case cr [0]=measure q [0], is received at point 404A. Avoidance component 106 can then determine if a cache exists that is associated with the buffered gates cx qr [0], qr [1], cx qr [1], qr [2], and cx qr [2], qr [3] at point 406A. As this is a first iteration and the gates have not been previously simulated, avoidance component 106 fails to find a cache at point 408A. In response to failing to find a cache, cache component 104 can simulate gates cx qr [0], qr [1], cx qr [1], qr [2], and cx qr [2], qr [3] at point 410A and create a cache with the gates as keys and outputted quantum states as values.

In in second iteration 401B, detection component 105 can detect a reset at point 402B. In response to receiving non-measure gate cx qr [0], qr [1], buffering component 109 can add gates cx qr [0], qr [1], cx qr [1], qr [2], and cx qr [2], qr [3] to a list of buffered gates, without simulating the gates until a first measure gate, in this case cr [0]=measure q [0], is received at point 404B. Avoidance component 106 can then determine if a cache exists that is associated with the buffered gates cx qr [0], qr [1], cx qr [1], qr [2], and cx qr [2], qr [3] at point 406B. As this is a second iteration and the gates were previously simulated and a cache was created at point 410A, avoidance component 106 succeeds in finding a cache at point 408B. In response to finding the cache at point 408B, avoidance component 106 can avoid simulating gates cx qr [0], qr [1], cx qr [1], qr [2], and cx qr [2], qr [3] at point 410B and instead use the cached quantum state.

It should be appreciated that in this example, by utilizing the cached quantum state at point 410B, efficiency in the simulation of instruction set 412 is improved as gates cx qr [0], qr [1], cx qr [1], qr [2], and cx qr [2], qr [3] are not simulated in the second iteration.

Figure 5:
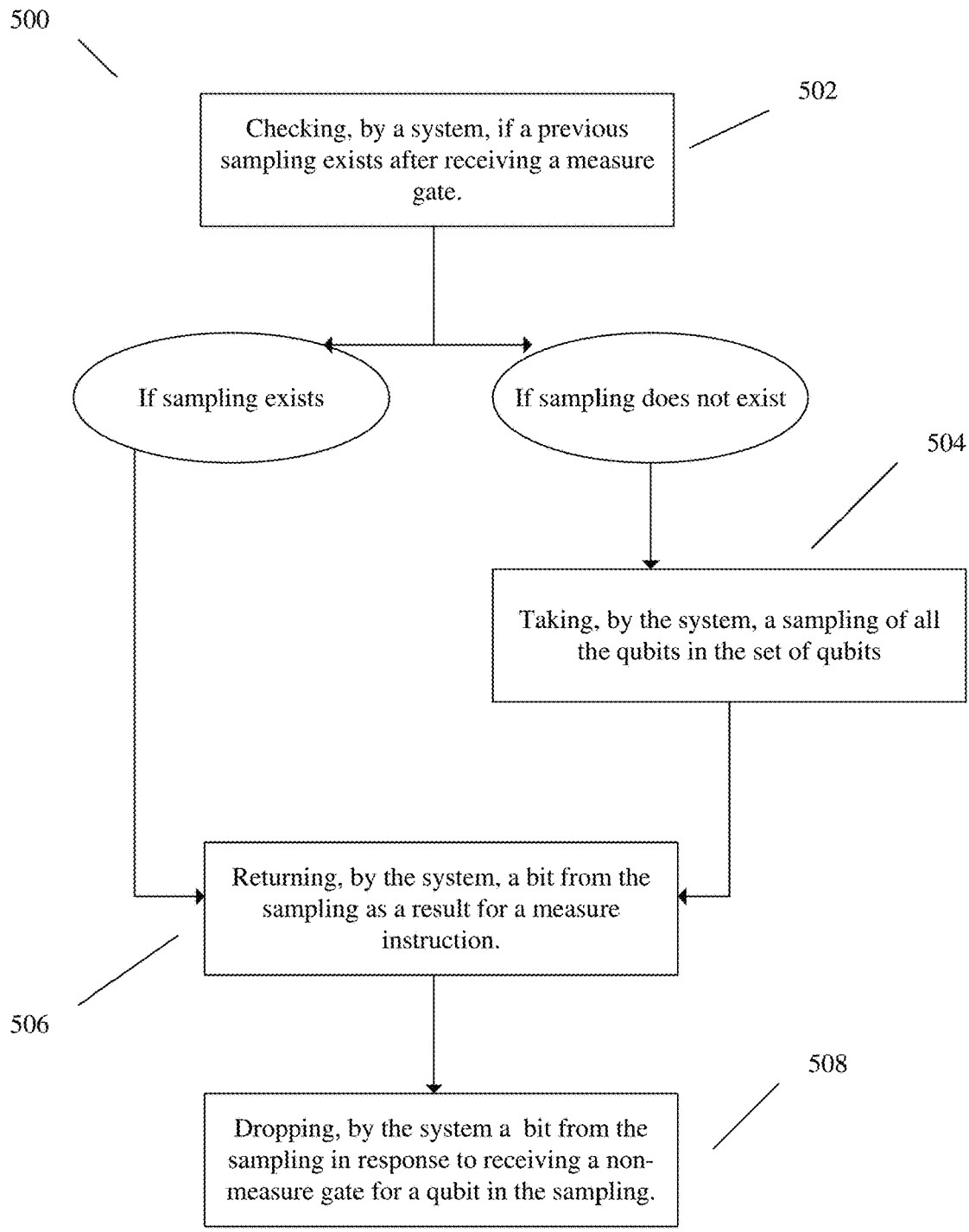
FIG. 5 illustrates a flow diagram of an example, non-limiting computer-implemented method that can facilitate sampling in a quantum gate-level simulation in accordance with one or more embodiments described herein.

FIG. 5 illustrates a flow diagram of an example, non-limiting computer-implemented method 500 that can facilitate sampling in a quantum gate-level simulation in accordance with one or more embodiments described herein. Repetitive description of like elements and/or processes employed in respective embodiments is omitted for sake of brevity.

At 502, computer-implemented method 500 can comprise checking, by a system (e.g., gate-level optimization system 101 and/or sampling component 107) operatively coupled to a processor (e.g., processor 103), if a previous sampling exists after receiving a measure gate instruction.

At 504, in response to a determination that a previous sampling does not exist, computer-implemented method 500 can comprise taking, by the system (e.g., gate-level optimization system 101 and/or sampling component 107), a sampling of all the qubits in the set of qubits. However, if a sampling does exist, computer-implemented method 500 can skip step 504 and proceed directly to step 506. For example, if the set of qubits comprises 3 qubits, then the sampling can have 3 values, such as [1,1,1], wherein each value in the sampling is a state of one of the qubits in the set.

At 506, computer-implemented method 500 can comprise returning, by the system (e.g., gate-level optimization system 101 and/or sampling component 107) a bit from the sampling as a result for the measure gate instruction. For example, if the measure gate instruction requests a measure for the second qubit in the set of qubits, sampling component 107 can return the second bit in the sample as the result of the measure gate and skip the performance of the measure gate.

At 508, computer-implemented method 500 can comprise dropping, by the system (e.g., gate-level optimization system 101 and/or sampling component 107) a bit from the sampling in response to receiving a non-measure gate instruction for a qubit in the sampling. For example, if sampling component 107 receives a non-measure gate instruction relating to the second qubit in the set of qubits, sampling component 107 can drop the bit from the example. In this example, if the sampling is [1,1,1] and the received non-measure instruction relates to the second qubit, sampling component 107 can drop the second bit from the sampling so that the sampling is then [1,-,1].

Figure 6:
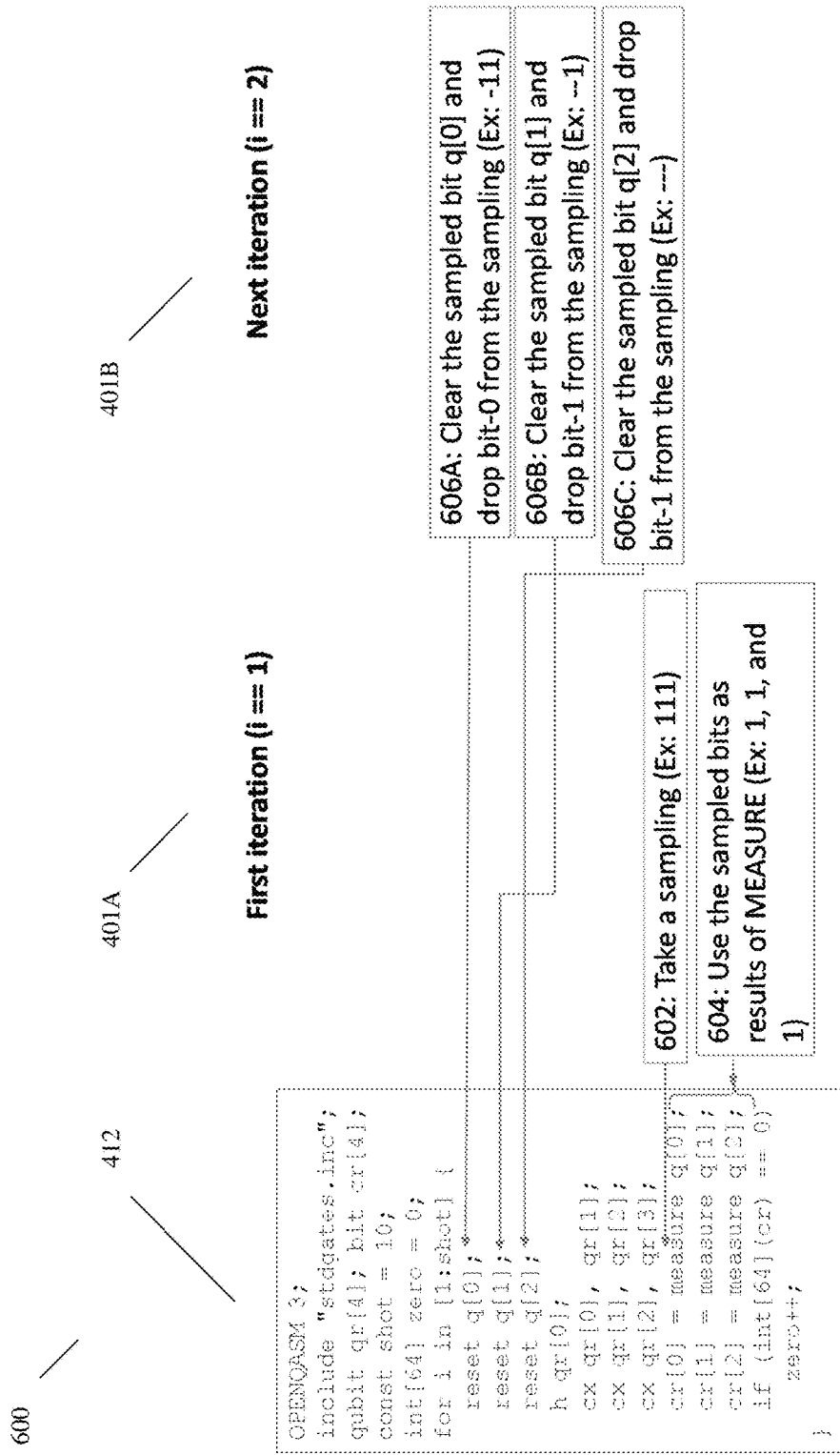
FIG. 6 illustrates an example non-limiting diagram representation of a set of quantum gate-level instructions and an implementation of caching of sampling accordance with one or more embodiments described herein.

FIG. 6 illustrates an example non-limiting diagram 600 representation of a set of quantum gate-level instructions and an implementation of sampling accordance with one or more embodiments described herein. Repetitive description of like elements and/or processes employed in respective embodiments is omitted for sake of brevity.

Diagram 600 comprises an instruction set 412 to implement a gate-level simulation. Diagram 600 additionally comprises a first iteration 401A of instruction set 412 and a second iteration 401B of instruction set 412. First iteration 401A comprises points 602 and 604, while second iterations 401B comprises points 606A-606C.

As described above in reference to FIG. 2, in response to receiving a measure gate, such as gate cr [0]=measure qr [0], sampling component 107 can check if a sampling already exists. During first iteration 401A a sampling will not exist, as it is the first iteration. In response to failing to find a sampling, sampling component 107 can take a sampling of all qubits at point 602. In an example, if qubits q [0], q [1], and q [2] all have a quantum state of 1, then the sample would be [1,1,1]. After taking the sampling at point 602, sampling component 107 can return a bit from the sample as a result to a measure gate at point 604. For example, sampling component 107 can return a quantum state value of 1 as a response to gate cr [0]=measure q [0] and avoid performing the measure gate. Sampling component 107 can similarly return values for measure gates cr [1]=measure q [1] and cr [2]=measure q [2].

During second iteration 401B, sampling component 107 can drop a bit from the sampling in response to receiving a non-measure gate at point 606A. For example, as sampling component 107 receives gate reset q [0], a non-measure gate, at point 606A, sampling component 107 can drop the bit from the sampling corresponding to q [0], resulting in the sampling being [-,1,1]. Similarly, sampling component 107 can drop bits at point 606B and 606C.

Figure 7:
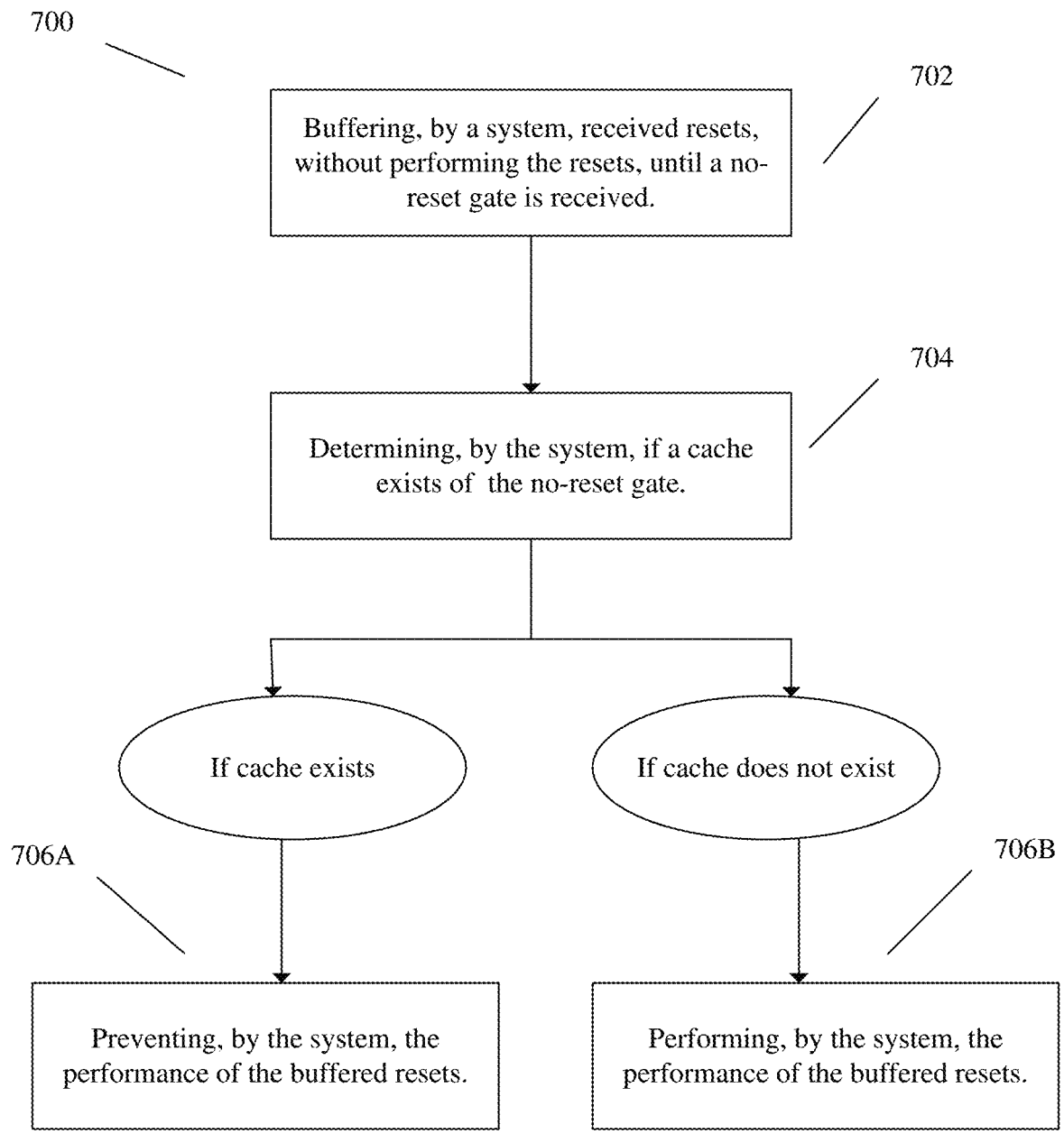
FIG. 7 illustrates a flow diagram of an example, non-limiting computer-implemented method that can facilitate performance of a list of resets in a gate-level quantum simulation in accordance with one or more embodiments described herein.

FIG. 7 illustrates a flow diagram of an example, non-limiting computer-implemented method 700 that can facilitate performance of a list of resets in a gate-level quantum simulation in accordance with one or more embodiments described herein. Repetitive description of like elements and/or processes employed in respective embodiments is omitted for sake of brevity.

At 702, computer-implemented method 700 can comprise buffering, by the system (e.g., gate-level optimization system 101 and/or evaluation component 108) operatively coupled to a processor (e.g., processor 103), received resets, without performing the resets, until a no-rest gate is received. For example, if evaluation component 108 receives reset instructions for all three qubits in a set of three qubits, evaluation component 108 can add all three resets to a list of buffered resets and not perform the rests. Once a no-reset gate is received, evaluation component 108 can stop adding resets to the list of buffered resets.

At 704, computer-implemented method 700 can comprise determining, by the system, (e.g., gate-level optimization system 101 and/or avoidance component 106), if there exists a cache entry of the no-reset gate. For example, avoidance component 106 can determine if the there is a cache entry of the no-reset gate as described above in reference to FIGS. 1 and 2.

At 706A, in response to determining that a cache does exist of the no-reset gate, computer-implemented method 700 can comprise preventing, by the system (e.g., gate-level optimization system 101 and/or evaluation component 108), the performance of the list of buffered resets. For example, as described above in detail in reference to FIGS. 1 and 2, a reset is only useful if a non-reset gate is actually simulated, otherwise the reset can be avoided. Thus, if a cache value exists of the no-reset gate, avoidance component 106 can avoid the simulation of the no-reset gate using the cache and thus evaluation component 108 can prevent performance of the buffered resets. Evaluation component 108 can then clear the list of buffered resets.

At 706B, in response to determining that a cache does not exist of the no-reset gate, computer-implemented method 700 can comprise performing, by the system (e.g., gate-level optimization system 101 and/or evaluation component 108), the list of buffered resets. For example, if there is not a cache value of the no-reset gate, then the no-reset gate will be simulated as described above in reference to FIGS. 1 and 2. As the no-reset gate will be simulated, evaluation component 108 can perform the buffered resets in order to facilitate the simulation of the no-reset gate.

Figure 8:
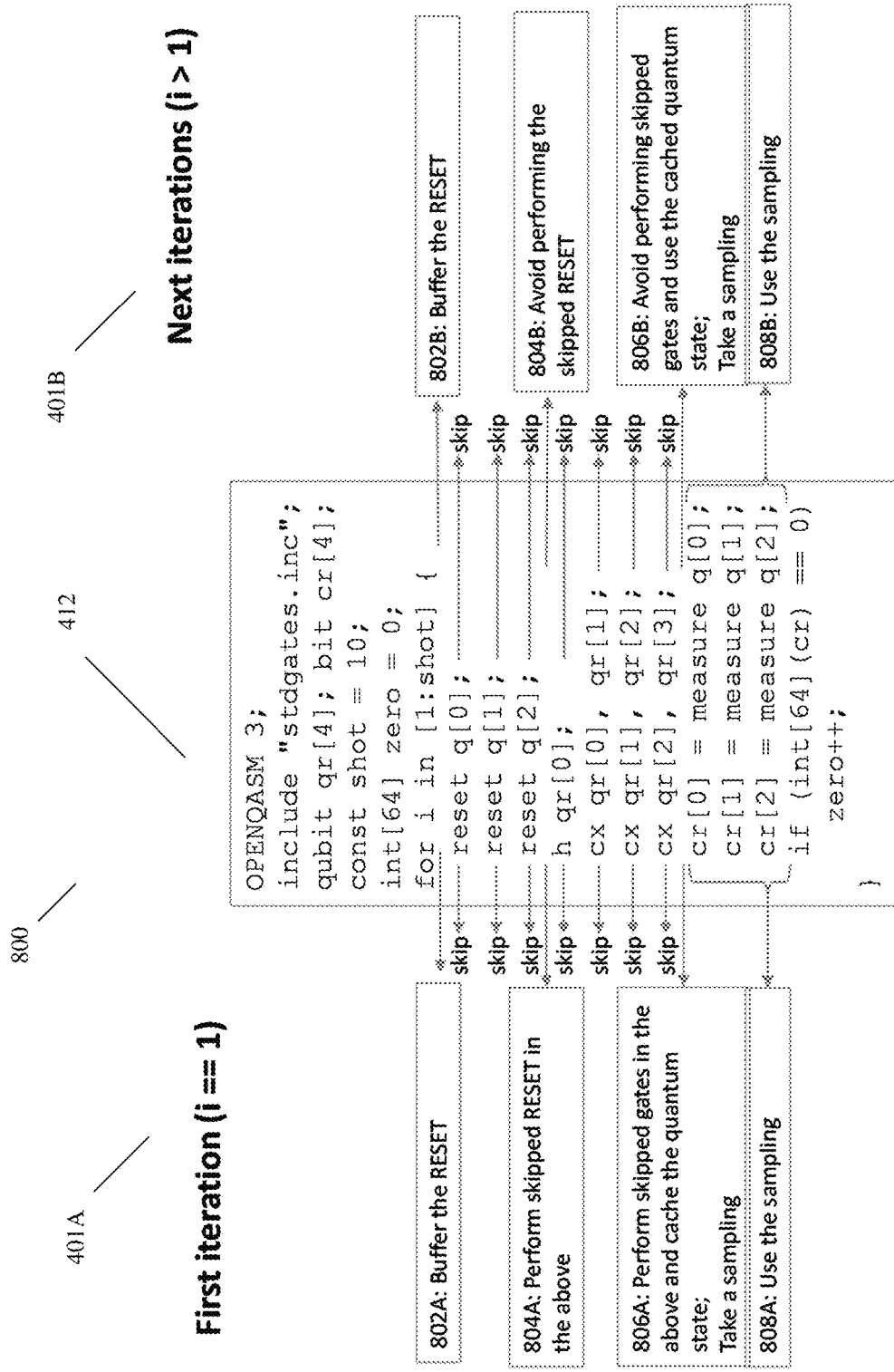
FIG. 8 illustrates an example non-limiting diagram representation of a set of quantum gate-level instructions and an implementation of sampling-optimization for gate-level simulations in accordance with one or more embodiments described herein.

FIG. 8 illustrates an example non-limiting diagram 800 representation of a set of quantum gate-level instructions and an implementation of sampling-optimization for gate-level simulation in accordance with one or more embodiments described herein. Repetitive description of like elements and/or processes employed in respective embodiments is omitted for sake of brevity.

Diagram 800 comprises an instruction set 412 to implement a gate-level simulation. Diagram 800 additionally comprises a first iteration 401A of instruction set 412 and a second iteration 401B of instruction set 412. First iteration 401A comprises points 802A-808A while second iterations 401B comprises points 802B-808B.

As described above in reference to FIG. 2, evaluation component 108 can buffer resets until a no-reset gate is received. For example, evaluation component 108 can buffer reset q [0], reset q [1], and reset q [2] and stop buffering resets after receiving non-reset gate cx qr [0], qr [1]. Evaluation component 108 can then check with cache component 104 if there is a cache associated with gate cx qr [0], qr [1]. As this is a first pass, there is no cache and evaluation component 108 can perform the buffered resets at point 804A. As described above in reference to FIGS. 2, 3, and 4, buffering component 109 can buffer gates cx qr [0], qr [1], cx qr [1], qr [2], and cx qr [2], qr [3] without performing them. Avoidance component 106 can then determine if a cache exists that is associated with the buffered gates. As this is a first pass, no cache exists and cache component 104 performs gates cx qr [0], qr [1], cx qr [1], qr [2], and cx qr [2], qr [3] and caches the quantum state produced by each at point 806A. Additionally, in response to receiving measure gate cr [0]=measure q [0], sampling component 107 can take a sampling at point 806A. Then, sampling component 107 return bits from the sampling as a response to measure gates at point 808A, completing first iteration 401A.

Second iteration 401B can begin with evaluation component 108 buffering q [0], reset q [1], and reset q [2] similarly at 802B, similarly to first iteration 401A. Evaluation component 108 can then check with avoidance component 106 if there is a cache associated with gate cx qr [0], qr [1]. As this is the second pass, a cache was created by cache component at point 806A. As such, evaluation component 108 can avoid performing the buffered resets at point 804B. Similarly to first iteration 401A, buffering component 109 can buffer gates cx qr [0], qr [1], cx qr [1], qr [2], and cx qr [2], qr [3] without performing them. Avoidance component 106 can then determine if a cache exists that is associated with the buffered gates. As a cache was created at point 806A by cache component 104, avoidance component 106 can avoid performing the buffered gates and use the cached quantum state. Additionally, at point 806B, sampling component 107 can take a sampling of all the qubits and used the sampling at point 808B, similarly to the use of the sampling at point 808A. In an embodiment, sampling component 107 can take multiple samplings at point 808A and store them in a sampling buffer. In this embodiment, rather than taking a sampling at point 806B, sampling component 107 can retrieve a sampling from the buffer of samplings.

Figure 9:
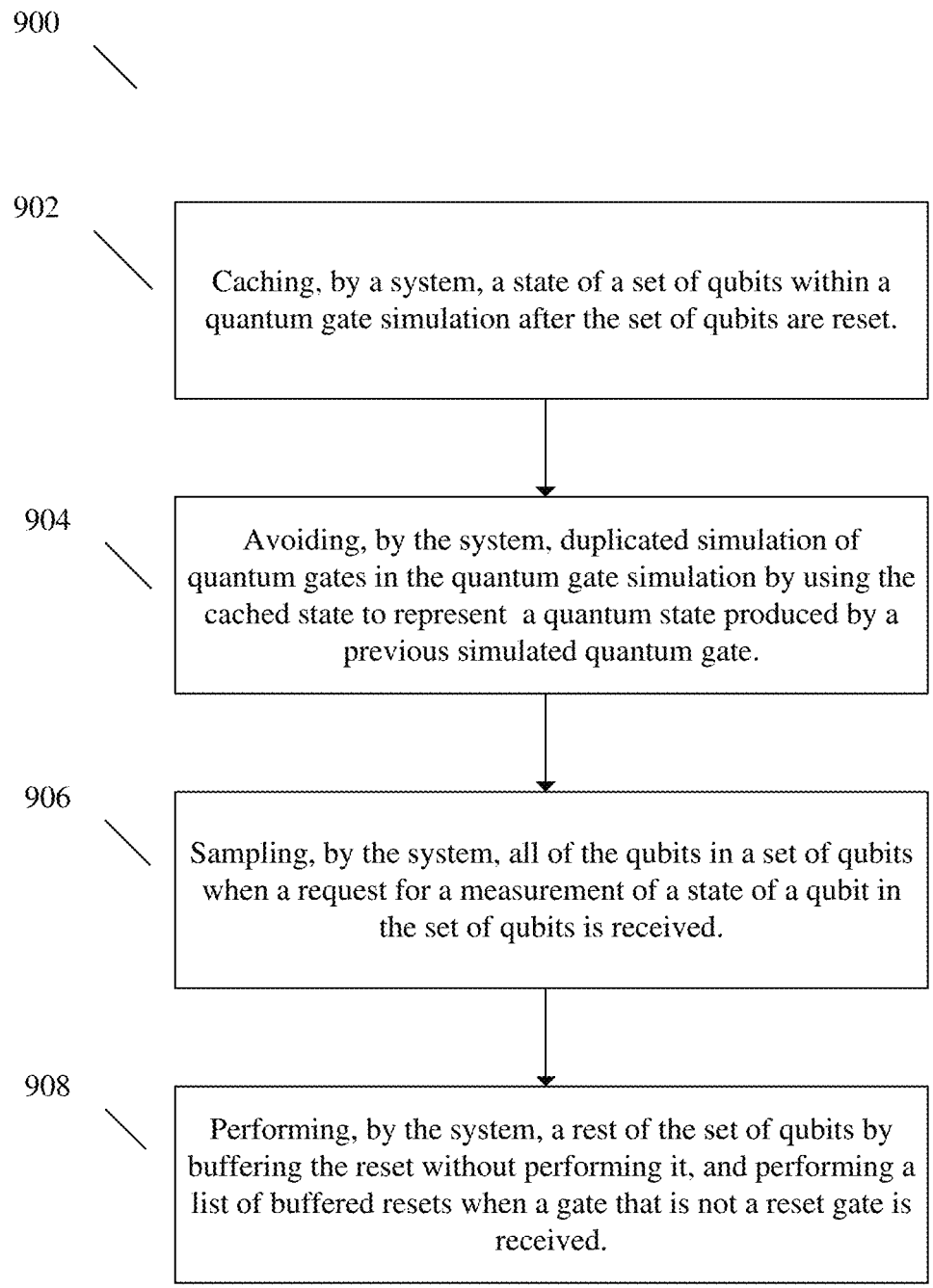
FIG. 9 illustrates a flow diagram of an example, non-limiting computer-implemented method that can facilitate sampling-optimization for gate-level simulations in accordance with one or more embodiments described herein.

FIG. 9 illustrates a flow diagram of an example, non-limiting computer-implemented method 900 that can facilitate sampling-optimization for gate-level simulations in accordance with one or more embodiments described herein. Repetitive description of like elements and/or processes employed in respective embodiments is omitted for sake of brevity.

At 902, computer-implemented method 900 can comprise caching, by a system (e.g., gate-level optimization system 101 and/or cache component 104) operatively coupled to a processor (e.g., processor 103), a state of a set of qubits within a quantum gate-level simulation after the qubits are reset.

At 904, computer-implemented method 900 can comprise avoiding, by the system (e.g., gate-level optimization system 101 and/or avoidance component 106), duplicated simulation of quantum gates in the quantum gate-level simulation by using the cached state to represent a quantum state produced by a previously simulated quantum gate.

At 906, computer-implemented method 900 can comprise sampling, by the system (e.g., gate-level optimization system 101 and/or sampling component 107), all of the qubits in a set of qubits when a request for a measurement of a state of a qubit in the set of qubits is received.

At 908, computer-implemented method 900 can comprise performing, by the system (e.g., gate-level optimization system 101 and/or evaluation component 108), a reset of the set of qubits by buffering the reset without performing it and performing a list of buffered resets when a gate that is not a reset gate is received.

Gate-level optimization system 101 can provide technical improvements to system, devices, component, operational steps, and/or processing steps associated with quantum simulations. For example, gate-level optimization system 101 can cache a state of a set of qubits within a quantum gate-level simulation after the set of qubits are reset. In another example, gate-level optimization system 101 can avoid duplicated simulation of quantum gates in the quantum gate-level simulation by using the cached state of the set of qubits to represent a quantum state produced by a previously simulated quantum gate. In the above examples, it should be appreciated that gate-level optimization system 101 can reduce resource usage and/or time involved in gate-level simulations by reusing cached states to avoid duplicated simulation.

In the above examples, it should be appreciated that gate-level optimization system 101 can provide technical improvements to a processing unit associated with gate-level optimization system 101. For example, by preventing duplicated simulation of quantum gates over multiple iterations of a quantum gate-level simulation by using a cached state from a set of qubits, the number of overall gate simulations performed during a gate-level simulation is reduced, thereby reducing the workload of a processing unit (e.g., processor 103) that is employed to execute the routines (e.g., instructions and/or processing threads) of the gate-level simulation. In another example, by preventing the performance of a set of buffered resets in response to determining a cache value exists for a non-rest gate, the number of overall reset gates or instructions performed is reduced, thereby reducing the workload of a processing unit (e.g., processor 103) that is employed to execute the routines (e.g., instructions and/or processing threads) of the gate-level simulation. In these examples, by reducing the workload of such a processing unit (e.g., processor 103), gate-level optimization system 101 can thereby facilitate improved performance, improved efficiency, and/or reduced computational cost associated with such a processing unit.

A practical application of gate-level optimization system 101 is that it can be implemented to enable more efficient quantum gate-level simulations. For example, by enabling more efficient quantum gate-level simulations, gate-level optimization system 101 can reduce the time used to complete gate-level simulations and/or allow for more gate-level simulations to be performed over a period of time.

It should be appreciated that gate-level optimization system 101 provides a new approach driven by quantum computing technologies. For example, gate-level optimization system 101 provides a new approach for implementing quantum gate-level simulations.

Gate-level optimization system 101 can employ hardware and or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, and/or another type of specialized computer) to execute defined tasks related to the various technologies identified above. Gate-level optimization system 101 and/or components thereof, can be employed to solve new problems that arise through advancements in employment of quantum computing systems, cloud computing systems, computer architecture, and/or another technology.

It is to be appreciated that gate-level optimization system 101 can utilize various combinations of electrical components, mechanical components, and circuitry that cannot be replicated in the mind of a human or performed by a human, as the various operations that can be executed by gate-level optimization system 101 and/or components thereof as described herein are operations that are greater than the capability of a human mind. For instance, the amount of data processed, the speed of processing such data, or the types of data processed by gate-level optimization system 101 over a certain period of time can be greater, faster, or different than the amount, speed, or data type that can be processed by a human mind over the same period of time.

According to several embodiments, gate-level optimization system 101 can also be fully operational towards performing one or more other functions (e.g., fully powered on, fully executed, and/or another function) while also performing the various operations described herein. It should be appreciated that such simultaneous multi-operational execution is beyond the capability of a human mind. It should be appreciated that gate-level optimization system 101 can include information that is impossible to obtain manually by an entity, such as a human user.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
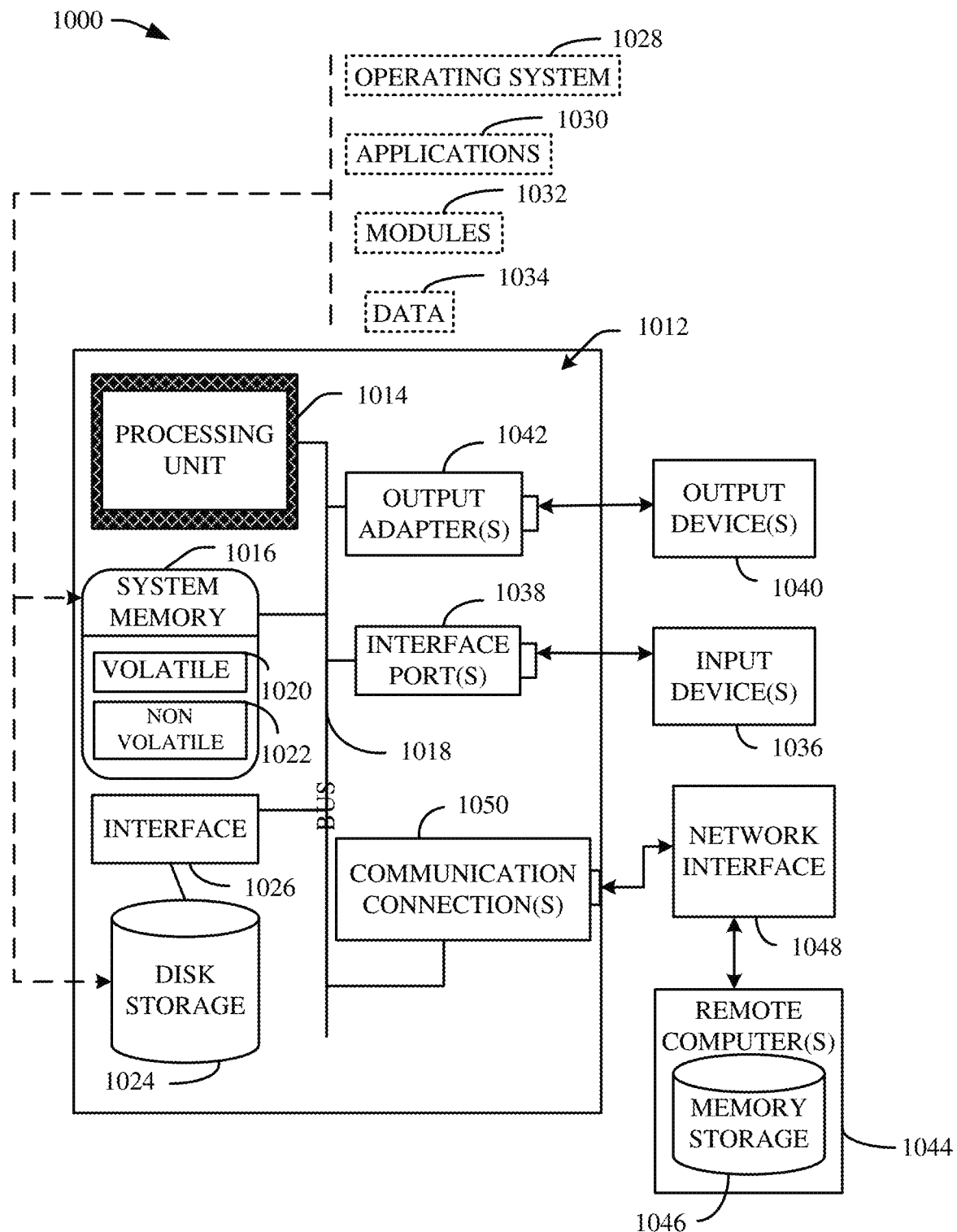
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and non-volatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 824, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 846 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, and/or another wire and/or wireless communication network. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/ software employed to connect the network interface 1048 to the system bus 1018. While communication connection 1050 is shown for illustrative clarity inside computer 1012, it can also be external to computer 1012. The hardware/ software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, and/or other program modules that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, where the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
a memory that stores executable components; and
a processor that executes computer executable components stored in memory, wherein the computer executable components comprise:
a cache component that caches a state of a set of qubits within a quantum gate-level simulation after the set of qubits are reset.

2. The system of claim 1, further comprising:
a detection component that detects whether the set of qubits in the quantum gate-level simulation are reset.

3. The system of claim 1, further comprising:
an avoidance component that prevents duplicated simulation of quantum gates in the quantum gate-level simulation by using the cached state of the set of qubits to represent a quantum state produced by a previously simulated quantum gate.

4. The system of claim 1, further comprising:
a sampling component that takes a sample of all the qubits in the set of qubits when a request for a measurement of a state of a qubit in the set of qubits is received.

5. The system of claim 1, further comprising:
an evaluation component that evaluates the reset of the set of qubits by buffering the reset without performing it and performing a list of buffered resets when a gate that is not a reset gate is received.

6. The system of claim 1, wherein the reset of the set of qubits is at a first time and wherein the cache component associates the state of the set of qubits with a list of quantum gates at a second time, wherein the second time is after the first time.

7. The system of claim 1, further comprising:
a buffering component that buffers gates that are not measured and not reset after setting the state of the set of qubits and updates the buffered gates after a first request for a measurement for a value of a qubit in the set of qubits is received.

8. A computer-implemented method, comprising:
caching, by a system operatively coupled to a processor, a state of a set of qubits within a quantum gate-level simulation after the set of qubits are reset.

9. The computer-implemented method of claim 8, further comprising:
detecting, by the system, whether the set of qubits in the quantum gate-level simulation are reset.

10. The computer-implemented method of claim 8, further comprising:
avoiding, by the system, duplicated simulation of quantum gates in the quantum gate-level simulation by using the cached state of the set of qubits to represent a quantum state produced by a previously simulated quantum gate.

11. The computer-implemented method of claim 8, further comprising:
sampling, by the system, all qubits in the set of qubits when a request for a measurement of a state of a qubit in the set of qubits is received.

12. The computer-implemented method of claim 8, further comprising:
  evaluating, by the system, the reset of the set of qubits by buffering the reset without performing it and performing a list of buffered resets when a gate that is not reset is received.

13. The computer-implemented method of claim 8, wherein the caching associates the state of the set of qubits with a list of quantum gates at a second time, wherein the second time is after the first time.

14. The computer-implemented method of claim 8, further comprising:
  buffering, by the system, gates that are not measured and not reset after setting the state of the set of qubits and updates the buffered gates after a first request for a measurement for a value of a qubit in the set of qubits is received.

15. A computer program product, the computer program product comprising one or more computer readable storage medium having program instructions embodied therewith, the program instructions executable by a processor to cause the processor to:
  cache, by the processor, a state of a set of qubits within a quantum gate-level simulation after the set of qubits are reset.

16. The computer program product of claim 15, the program instructions further executable by the processor to cause the processor to:
  detect, by the processor, whether the set of qubits in the quantum gate-level simulation are reset.

17. The computer program product of claim 15, the program instructions further executable by the processor to cause the processor to:
  avoid, by the processor, duplicated simulation of quantum gates in the quantum gate-level simulation by using the cached state of the set of qubits to represent a quantum state produced by a previously simulated quantum gate.

18. The computer program product of claim 15, the program instructions further executable by the processor to cause the processor to:
  sample, by the processor, of all the qubits in the set of qubits when a request for a measurement of a state of a qubit in the set of qubits is received.

19. The computer program product of claim 15, the program instructions further executable by the processor to cause the processor to:
  evaluate, by the processor, the reset of the set of qubits by buffering the reset without performing it and performing a list of buffered resets when a gate that is not a reset gate is received.

20. The computer program product of claim 15, the program instructions further executable by the processor to cause the processor to:
  buffer, by the processor, gates that are not measured and not reset after setting the state of the set of qubits and updates the buffered gates after a first request for a measurement for a value of a qubit in the set of qubits is received.

* * * * *